United States Patent [19]

Vargas, Jr.

[11] Patent Number: 4,829,391
[45] Date of Patent: May 9, 1989

[54] HIGH SPEED INTEGRATED CHARGE PUMP CIRCUIT FOR PHASE LOCK LOOPS

[75] Inventor: Rudolph Vargas, Jr., Alhambra, Calif.

[73] Assignee: Micropolis Corporation, Chatsworth, Calif.

[21] Appl. No.: 81,653

[22] Filed: Aug. 4, 1987

[51] Int. Cl.$^4$ .................. G01R 25/00; H03L 7/08; G11B 20/10

[52] U.S. Cl. .................................. 360/51; 331/25

[58] Field of Search .................... 360/51; 331/25

[56] References Cited

U.S. PATENT DOCUMENTS 4,244,043  1/1981  Fujita et al. ........................ 331/25
4,668,918  5/1987  Adams ................................ 331/25

*Primary Examiner*—Alan Faber
*Assistant Examiner*—Kevin J. Fournier
*Attorney, Agent, or Firm*—Poms, Smith, Lande & Rose

[57] ABSTRACT

The subject invention provides a digital Storage System such as a Winchester Hard Disk Drive System having a motorized hard disk drive assembly which interacts with a head positioner to read and write data and timing instructions onto a plurality of disks driven by the assembly. The drive system includes a data separation circuit for reconstruction of data recorded on the hard disk. The data separation circuit includes a phase-locked loop system. The phase-locked loop system includes a phase comparison circuit, a voltage controlled oscillator, a control circuit including a capacitor for controlling said oscillator, and a charge pump for pumping up and pumping down the control circuit. Except for the phase comparison circuit, the entire phase-locked loop system is provided on a monolithic integrated chip. Included within the integrated circuitry is the charge pump which has lateral PNP transistors which provide a steady current source and also has NPN transistors which provide fast, dynamic switching, including selective diversion of the constant current, enabling the capacitor of the control circuit to both charge up and charge down on command of the charge pump using the high speed NPN transistors.

9 Claims, 4 Drawing Sheets

HIGH SPEED INTEGRATED CHARGE PUMP CIRCUIT FOR PHASE LOCK LOOPS

BACKGROUND AND FIELD OF THE INVENTION

1. Field of the Invention

This invention relates to an improved data separation circuit having a phase-locked loop (or "phase lock loop") for use in digital storage systems of the Winchester disk drive type.

2. Background of the Invention

Modern computer systems may be generally characterized as being controlled by a central, keyboard accessible, processing unit (CPU), which is connected to external modems for communication and disk drives for the storage of data (in excess of the memory capability commonly found in today's microprocessor based systems). This external digital data may be stored on flexible or "floppy" disks or on hard or Winchester-type disks by the magnetization of successive small sectors on the magnetic surface of the disk, by means of a magnetic head as the disk rotates. The density of digital storage on hard disk memory systems is on the order of ten to twenty times the density achieved with floppy disk memory systems. Winchester disk drive systems generally have a plurality of hard disks made from aluminum and coated with some type of recording media such as a magnetic oxide or magnetic metallic material. Each side of the disk is coated with recording media and each side can store data. Each surface of the disk is associated with its own read and write head.

The read and write heads are mechanically linked together to form a head positioner assembly and the heads move as a single unit across the surface of the disk. Disks are preferably driven by a DC brushless motor at a relatively high speed in the order of 3600 revolutions per minute (RPM. Hard magnetic storage disks were originally relatively large in diameter, but have in the last few years, been reduced in size so that 5¼" diameter disk systems are now widely available. As the size of the hard disk drives have become continually smaller, the storage capacity of the disk system has become progressively larger. Recent series disk drives provide in excess of 380 M bytes of data in a standard 5.25 inch disk system, where "M bytes" stands for millions of bytes of digital storages, and each byte contains eight binary digits or bits of data.

Data stored on the hard disks of a Winchester disk drive system is useful only if the data may be retrieved from the disk by the central processing unit in an orderly and logical fashion. The actual signals recorded on a disk represent a combination of timing information (clock) and data. The serial data is assembled into eight bit bytes for transfer to a system memory.

Interfacing between the microprocessor system and the disk drive is generally accomplished by large scale integrated (LSI) disk controllers which perform the functions of disk drive selection, track selection, sector selection, head loading and error checking. In addition to or as part of the disk controller function, data separation and decoding circuitry is necessary to allow the interface system to synchronize itself to the actual data rate of the disk drive so the data may be transferred in an orderly manner to the central processing unit. The data rate detected by the data separation circuitry varies from drive to drive due to mechanical factors such as motor speed tolerances. In order for a Winchester disk drive system to operate reliably and for the LSI disk controller to transfer data to the central computer in a reliable manner, the data separation circuitry is preferably based on phase-locked loop (PLL) technology. The function of the data separation logic is to synchronize the interface circuitry with the data stream coming from the disk. The controller uses a window established by the separator to reconstruct the data previously recorded on the hard disk drive system. Within the data separation circuit, an analog phase-locked loop may provide the reliability required for accurate data separation. The phased locked loop constantly analyzes the frequency of input real time signal from the hard disk drive and locks a variable oscillator, usually a voltage-controlled oscillator, to that frequency. Using analog PLL techniques, a data separator circuit can be designed so as to achieve better than plus or minus one nanosecond resolution. The analog PLL determines the clock and data bit positions by sampling each bit in the serial data stream. The phase relationship between the data bit stream and a voltage controlled oscillator is constantly fed back to adjust the frequency of the oscillator and the resultant position of the data window, enabling the PLL to track input data frequency changes, and thereby reliably read previously recorded data from a hard disk drive system.

Generally, the variable frequency voltage control oscillator of the phase-locked loop system as used in conjunction with a hard disk drive, has a variable capacitor or varactor which acts as a primary component of a control circuit which controls the frequency output of the oscillator. This variable capacitor or varactor in turn is characteristically controlled by a charged pump circuit and an associated capacitor network. The charge pump circuit either charges up or charges down the capacitor network in order to move or change the voltage applied to the varactor and the resultant frequency output of the variable oscillator and thereby move the data window to track the real time signal that is received from the disk drive storage.

FIG. 5 shows the prior art configuration of the internal circuit of the charge pump of a phase-locked loop. The output 50 of the charge pump of FIG. 5 is tied to the capacitor 57. When a pulse 52 is imparted on the base of NPN transistor 54, the capacitor of the control circuit is allowed to discharge by way of pathway 56 through the controlled collector-emitter circuit of transistor 54 to ground 55. On the other hand, if the capacitor tied to output 50 needs to be charged up, a pulse 58 would be imparted onto PNP transistor 51, turning PNP transistor 51 "on" and allowing current to flow through PNP transistor 51 and out through conductive pathway 59 to the control circuit which is tied to the capacitor 57 of the output 50. The circuitry shown in FIG. 5 is a discrete component circuitry and part of an overall hybrid board system for charging the capacitor network of the control circuit "up" or "down"; thereby, changing the output frequency of the voltage-controlled oscillator. It can be seen that PNP transistor 51 and NPN transistor 54 are coupled in a push-pull configuration to achieve up and down charging of the capacitor 57 that is tied to the output 0. This circuit is adequate; however space limitations dictate the need for the entire data separation circuitry to be embodied in a single monolithic integrated circuit chip.

A single integrated circuit chip embodying such phased locked loop data separation circuitry could be fabricated but would not exactly emulate the structure and function of the discrete component circuitry of the hybrid chip, especially that of the charge pump shown in FIG. 5. Transistor-transistor logic (TTL) is generally chosen for integrated circuit fabrication because the TTL integrated circuits are known for high switching speed and good noise immunity Good noise immunity means reliable operation of a digital system even where heavy electrical equipment (such as motors or high current relays) are nearby. Although this form of integrated circuitry provides the fast speed that is necessary to maintain a data window for a hard disk drive system, there is a limitation on the different types of components that are available to be etched or formed onto the photoresist surface monolithic integrated circuit. For example, the push-pull configuration of PNP transistor 51 and NPN transistor 54 (of FIG. 5) is difficult to reconstruct in the fast vertical transistor geometry normally associated with TTL integrated circuits. Laterally-directed PNP transistors may be established across the top surface of an integrated circuit, but these lateral PNP transistors are substantially slower in speed than the NPN transistors. NPN transistors typically are good current sinks and useful for discharging the capacitor of the control circuit of a phased-locked loop; however, only PNP transistors are traditionally good current sources for use in charging up a capacitor, as shown in FIG. 5, and discussed above.

Thus, the problem presented when one looks to convert from discrete component circuitry to integrated circuitry (in a hard disk drive system) has not easily been solved heretofore. Designing a data separation circuit which is fully integrated is difficult to achieve.

Accordingly, an object of the invention is to provide a high speed integrated separation circuit, including a phase-locked loop.

SUMMARY OF THE INVENTION

In accordance with a specific illustrative preferred embodiment, the invention involves an integrated circuit chip which may be used in a Winchester hard disk drive system, and which provides a fully integrated charge pump capable of high speed switching. The system includes a hard disk drive system having an integrated circuit phase-locked loop which derives real time signals from a hard disk drive and compares them to signals derived from an internal local oscillator which is variable and synchronized to the pulses sent from the hard disk drive. The phase-locked loop separation circuitry includes the controllable oscillator, mentioned above, a voltage control circuit for determining the frequency of the oscillator, and a control circuit which includes a variable capacitor (or varactor) for changing the tuned circuit frequency of the controlled oscillator circuit. A charge pump is provided for charging and discharging the capacitance of the loop compensator network which is responsive to the output signal of the phase comparison circuitry which synchronizes the local oscillator with signals from the hard disk drive. The charge pump provides high speed NPN switching transistors which are used as a current sink to discharge the capacitor of the control circuit. Also, a portion of the charge pump circuitry comprises an array of NPN transistor elements which is capable of charging up the capacitor when activated by a pulse signal by diverting current to provide a pathway for the charge pump to charge up the capacitor. Thus, charge "up" and charge "down" is achieved all with the use of NPN transistor elements, so that no slower lateral PNP transistors are needed to perform switching functions.

The disclosed invention may be considered to be within a Winchester hard disk drive system which has a motorized hard disk drive assembly interacting with a head positioner to read and write data and timing instructions onto a plurality of hard Winchester disks driven by the assembly. The disk drive system includes a data separation circuit for reconstruction of data recorded on the hard disk, the data separation circuit comprises a phase-locked loop system which includes a phase comparator circuit; a voltage controlled oscillator; a control circuit including the capacitance of the loop compensator circuit, capacitor for controlling the oscillator; and, a charge pump means for pumping up and pumping down said control circuit. The phase comparison circuit of the subject invention receives a variable reference frequency signal from the oscillator and compares the variable frequency signal with the real time frequency signal derived outside the phase-locked loop system from the hard disk drive assembly.

The phase comparison circuit has an output phase difference signal which is provided to the charge pump. The output phase difference signal is a function of the difference between the reference frequency signal and the real time frequency signal. The charge pump includes a monolithic integrated circuit having a region which comprises a current source circuit for providing a steady and uniform operational signal. The current source circuit includes lateral PNP bipolar transistor elements and is relatively slower acting. The current source circuit provides a steady current source that is processed by the dynamic switching portion of the charge pump. The charge pump also includes a dynamic switching circuit for rapidly switching the steady current signal provided by the current source circuit. The charge pump includes a first NPN network of bipolar components for charging "up" the capacitor within the control circuit and a second NPN network of bipolar components for charging "down" the capacitor, where the charging up and charging down is commenced in response to the output phase difference signal from the phase comparison circuit. The control circuit which includes the capacitor that is being charged by the charge pump operates to vary the reference frequency signal output from the oscillator. In this manner, the phase-locked loop system locks onto the real time frequency signal from the hard disk drive, enabling the phase locked loop to synchronize the reference frequency signal and the disk-derived real time frequency signal, creating a data window through which the disk controller circuitry is able to process data read from the hard disk as well as read and write onto the disk at a data rate derived within the data window which may be logically processed. The dynamic current region of the charge pump portion of the integrated circuit is configured from transistor elements of a uniform and homogeneous characteristic nature; for example, the dynamic region of the charge pump circuit may be characterized by all bipolar NPN transistor elements.

In accordance with a broad aspect of the invention, the charge pump included in data separation circuitry associated with data retrieval from high speed rotating disk type storage units, may be formed of integrated circuits, in which transistors of one type, such as NPN transistors, operate at higher switching speed than transistors of another type, such PNP transistors. The phase-locked loop includes a voltage controlled oscillator and a controlling capacitor which is selectively charged or discharged to shift the frequency of the voltage controlled oscillator. The present invention involves the use of the high speed type of switching transistor to implement both the charging and discharging of the capacitor, with one of these functions being accomplished by developing a constant flow of current, and rapidly diverting this current flow to the capacitor to provide an incremental positive or negative charge to the capacitor.

DETAILED DESCRIPTION OF THE DRAWINGS

Figure 1:
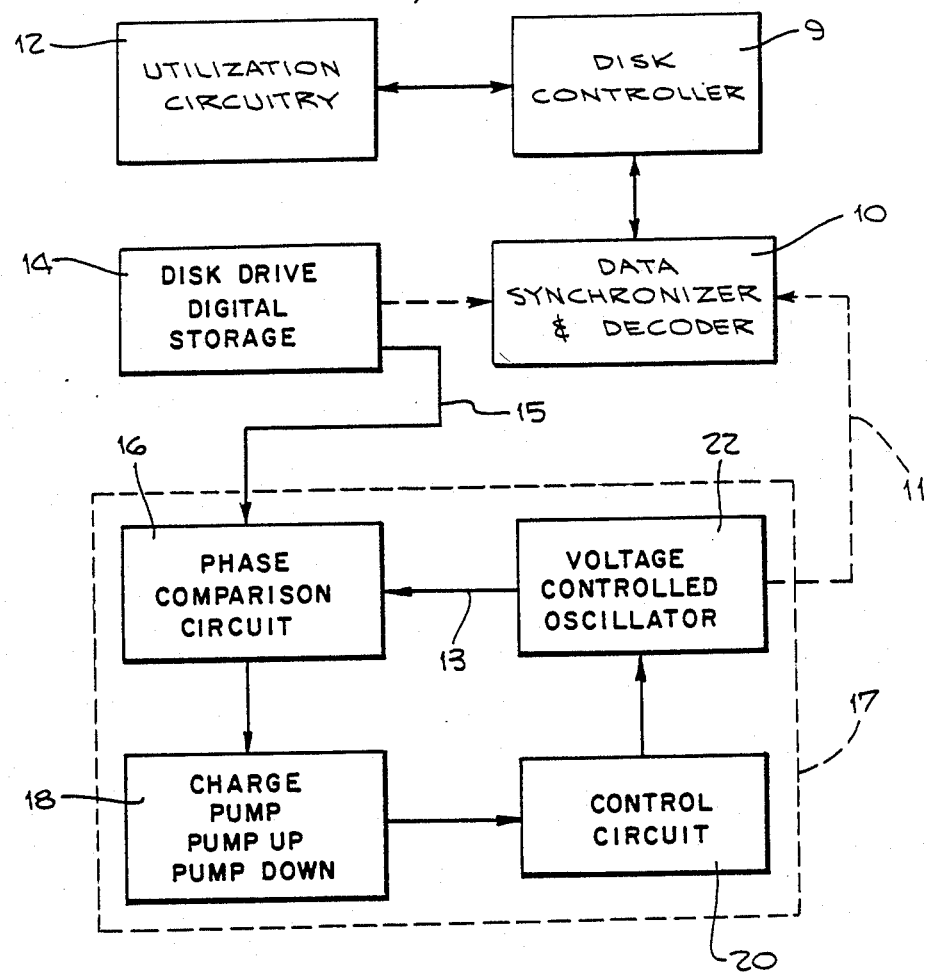
FIG. 1 is a block diagram of a digital storage system including a data separation phase-locked loop.

With reference to FIG. 1, the block diagram of a data separation circuitry including a phase-locked loop, is shown. Utilization circuitry 12 includes a central processing unit and related microprocessor functioning units which require the use of an external memory storage system such as the disk drive digital storage unit 14. Intercoupling the utilization circuit 12 and the disk drive 14 are the disk controller 9 and the data synchronizer and decoder 10. In order for the data synchronizer and decoder circuit 10 to interpret the data that is stored in the disk drive digital storage unit 14, the phase-locked loop circuitry 17 must interface with both the disk drive digital storage 14 and the circuit 10 in order to synchronize the disk controller circuitry with the data rate provided by the disk drive digital storage 14. The phase-locked loop system 17 includes a phase comparison circuit 16, a charge pump 18, a control circuit 20, and a voltagecontrolled oscillator 22.

A real time frequency signal derived from the disk drive digital storage 14 along circuit 15 is compared with a variable reference frequency signal derived from the output (along circuit 13) of a voltage-controlled oscillator 22 by the phase comparison circuit 16. After the phase comparison circuit 16 compares the real time frequency signal with the variable reference frequency signal, an error signal is derived at the output of the phase comparison circuit 16. This output signal is provided to the charge pump 18. When the phase comparison circuit 16 signals the charge pump 18 to pump "up" the control circuit 20, a constant current source signal is provided by the charge pump 18 to the control circuit 20 which charges "up" a capacitor within the control circuit 20. When the phase comparison circuit 16 indicates to the charge pump 18 that the charge pump 18 should "pump down", the charge pump provides a constant current sink to the control circuit 20 allowing the capacitor (not shown in FIG. 1) associated with the control circuit 20 to discharge.

The control circuit 20 then provides a control signal to the voltage-control oscillator 22 which then responds by adjusting its output frequency both along pathway 13 and pathway 11 to change frequency, so as to follow the real time frequency signal derived from the disk, and sensed along pathway 15 from the disk drive digital storage 14. The phase comparison circuit 16, charge pump 18, control circuit 20 and voltage controlled oscillator 22 act together as a phase-locked loop whereby the output frequency signal along pathway 11 which the voltage-controlled oscillator 22 provides to the circuit 10 is phase-locked onto the output frequency of the data from the disk drive digital storage 14. The phase locked loop system 17 is thus able to synchronize the reference frequency signal and the real time frequency signal, creating a data window. This data window created by the phase locked loop 17 allows the utilization circuitry to process data stored on the hard disk and read data from said disk at the data rate derived in the data window which may be logically processed by the circuit 10. Once frequency lock is achieved, the phase comparison circuit 16 will, during intervals of phase lock, provide no output error signal to the charge pump. Thus, the charge pump 18 becomes a three-state device, capable of responding to signals from the phase comparison circuit 16 to either pump "up", pump "down" or "not enable" the control circuit 20, thereby allowing the voltage controlled oscillator 22 to remain locked into a desired output frequency which is then provided along pathway 11 to the circuit 10.

By constantly monitoring the output of th voltage-controlled oscillator along pathway 13, the phase comparison circuit 16 continues to compare this output of the voltage-controlled oscillator 22 with the real time frequency signal which it derives along pathway 15 from the disk drive digital storage 14. Thus, the phase lock loop circuit 17 not only initially synchronizes the frequency output of the voltage-controlled oscillator 22 with the real time frequency signal derived from the disk drive digital storage 14, but also acts to maintain and follow the real time frequency signal derived along pathway 15 in such a manner that the output of the voltage-controlled oscillator 22 along pathway 11 back to the circuitry 10 will always reflect the real time data rate of information arriving from the disk drive digital storage 14

Figure 2:
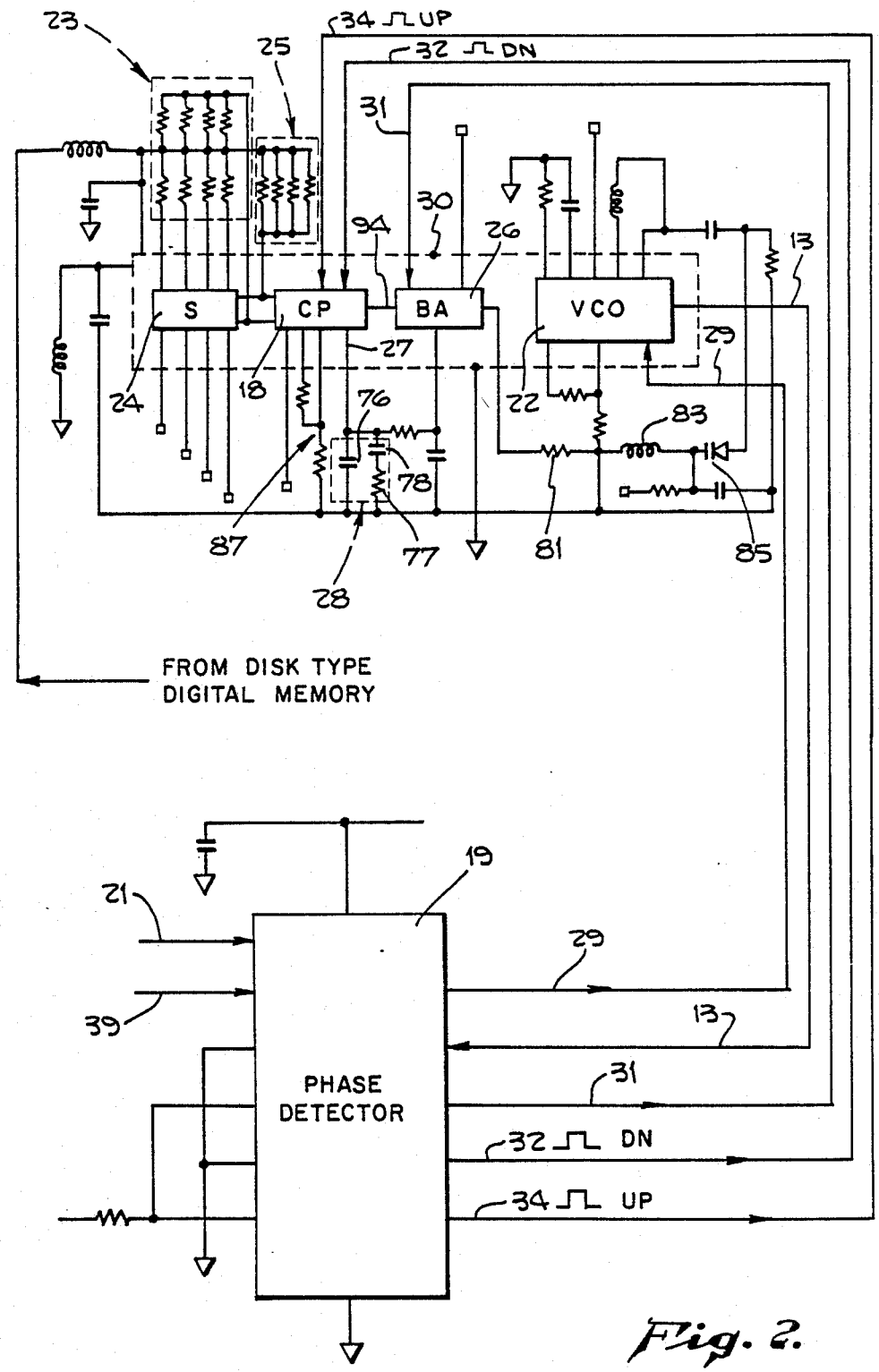
FIG. 2 is a schematic diagram of the phase-locked loop circuit within the data separation circuit of the hard disk drive system.

Referring to FIG. 2, a schematic diagram of the phased-locked loop shown in FIG. 1, will be described in more detail. The circuitry 9, 10, or 12 of FIG. 1 provides an enabling input 39; and, a circuit 21 provides the real time frequency signal from the hard disk drive to the phase detector 19. The phase detector 19 compares the frequency signal received along circuit 21 with the variable frequency signal output of the voltage-controlled oscillator 22 along circuit 13. If there is a difference in frequency and/or phase between these two signals, detector 19 will send a pump down signal 32 or a pump up signal 34 to the charge pump 18 of the integrated circuit 30. Also operatively associated with the charge pump 18 are trimming networks 23 and 25 which are used to initialize the internal circuitry of the charge pump 18 (which will be discussed later). The strobe 24 is employed during testing to artificially introduce a simulated phase shift signal to check the operation of the VCO. Returning to normal operation, the charge pump 18, responsive to the charge down signal 32 or the charge up signal 34, provides the appropriate output to the loop compensator network 28 which is composed of a resistor in series with a principal capacitor 78 and a low pass filtering capacitor 76. Capacitor 76 is in parallel with the capacitor 78 and the resistor 77 of the network 28.

When a charge down signal 32 is provided to the charge pump, the output of the charge pump along pathway 27 provides a manner of discharging in a linear fashion the capacitor 78. Likewise, when a charge up signal 34 is provided to the charge pump 18, the output of the charge pump along pathway 27 provided to the capacitor 78 charges the capacitor 78 in a uniform and linear manner from a constant current source within the charge pump 18, the structure and function of which will be described in relation to FIGS. 3 and 4. The buffer amplifier 26 isolates the charge pump from direct contact with the voltage-controlled oscillator 22 and also provides feedback along lead 94 to the charge pump 18 in a manner which will enhance the switching speeds of the charge pump 18. (The details of the feedback from the buffer amplifier 26 to the charge pump 18 will be discussed later.)

It is sufficient to say that the charge up or charge down signal from the charge pump is passed by the buffer amplifier 26 through the resistor 81. From the resistor 81, the charge up or charge down signal through the voltage-controlled oscillator 22 is then provided to the inductor 83 and a varactor 85, which acts as a variable capacitor with respect to the voltage-controlled oscillator 22. The varactor 85 is a voltage-controlled capacitive element and is responsive to the output signal from the buffer amplifier 26, which in turn is indicative of either a charge up or charge down signal from the charge pump 18. From the varactor 85, the output signal of the charge pump is imparted to the voltage-controlled oscillator 22. The output signal from the voltage-controlled oscillator along circuit 13, back to the phase detector 19, is then varied in frequency proportional to the input voltage signal from the varactor 85 responding to the instructions of the charge pump 18. (Initial enablement and disengagement of the voltage-controlled oscillator 22 is accomplished by the phase detector 19 along pathway 29.) The buffer amplifier 26 may also be adjusted by command from the phase detector 19 along pathway 31.

The charge pump 18, according to FIG. 2, provides constant current increments, either positive or negative, to the capacitive components of the loop compensator network 28, so that the voltage-controlled oscillator 22 is controlled in a linear fashion. It will additionally be noted that the resistive network 87 is provided to the charge pump to double the flow of current from the charge pump to the buffer amplifier 26 thereby doubling the rate at which the constant current source fills the capacitor 78 on charge up or drains the capacitor 78 on charge down. Network 87 is drawn into operational play as the higher frequencies of switching are approached, thereby allowing the maintenance of a wider dynamic voltage range and assuring a wider capture range of the phase-locked loop represented by the circuitry in FIG. 2.

Figure 3:
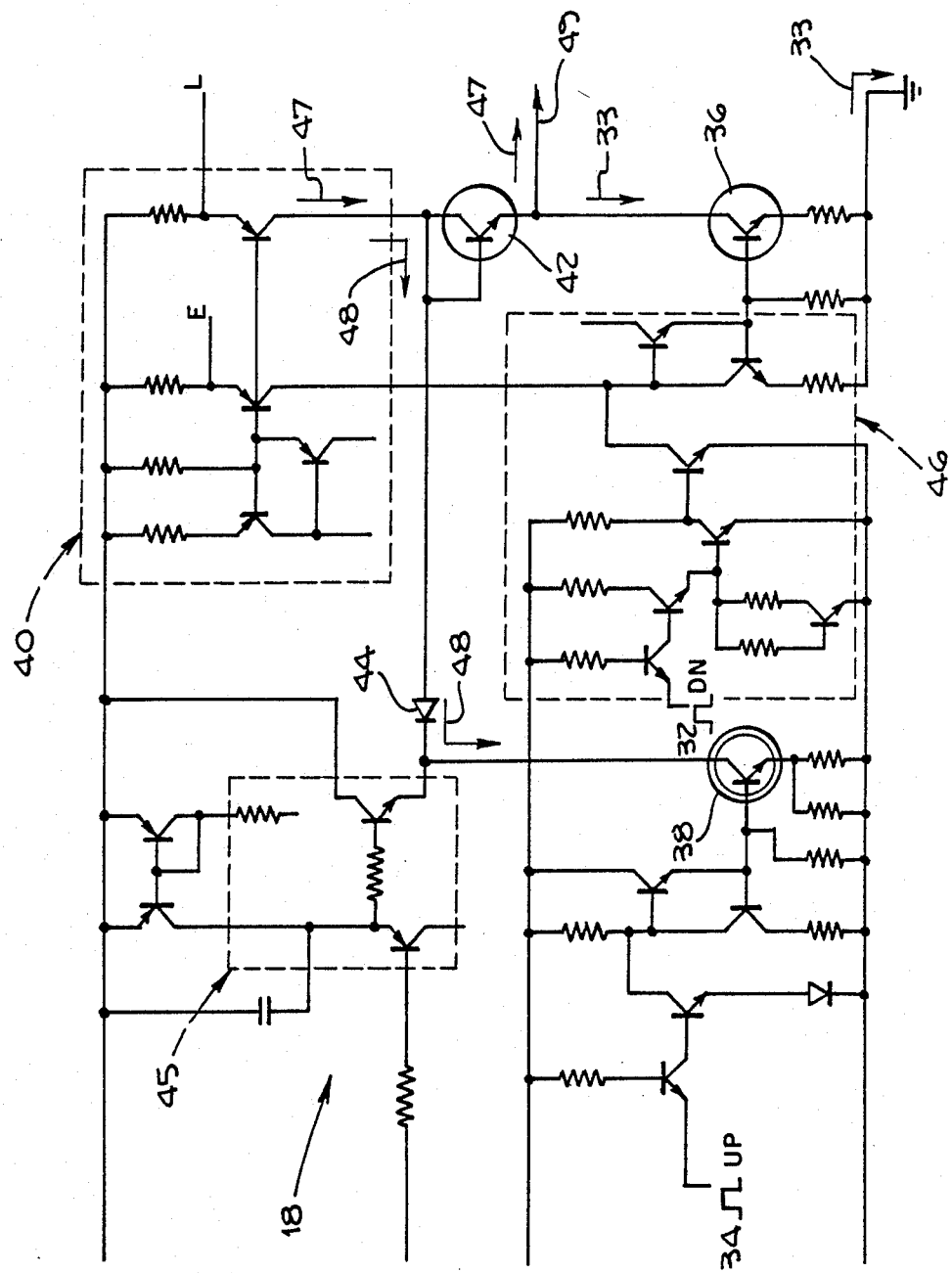
FIG. 3 is a schematic diagram of one embodiment of the internal circuitry of the charge pump of FIG. 2.

Turning to FIG. 3, an alternative embodiment of the detailed schematic diagram of the internal operation of the charge pump 18 of FIG. 2 is shown generally. A current mirror 40 provides a static DC current by use of lateral PNP transistors in the integrated circuit framework. The currents is provided by the circuit 40 and kept in balance by "early" (E) and "late" (L) bias currents which the network 25 (of FIG. 2), provides to the charge pump 18. When a charge down signal 32 is provided by the phase detector 19 (FIG. 2), transistor 36 is turned on allowing the capacitor 78 (FIG. 2) of the control circuit to linearly discharge along pathway 33 through transistor 36 to ground. It will be noted that active elements in the dynamic switch and in the network defined by the dotted boundary 46 are all implemented by NPN transistors and therefore are capable of fast switching and use in a dynamic circuit setting.

Figure 5:
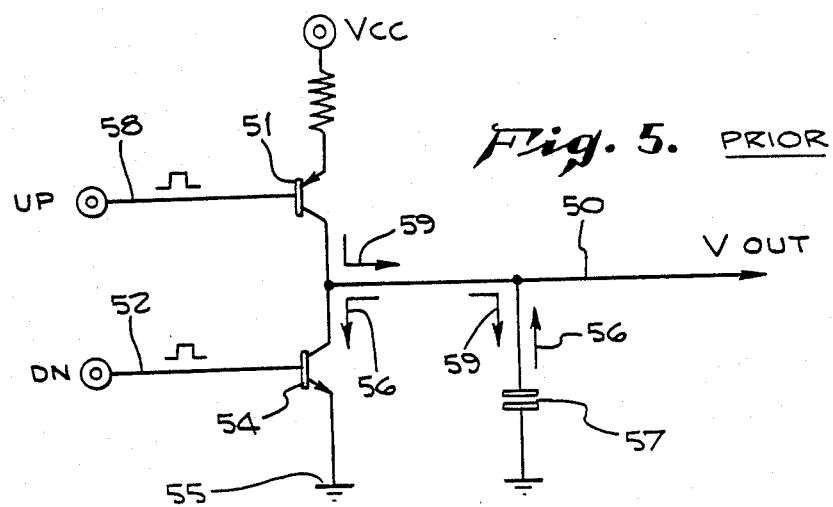
FIG. 5 shows the internal circuit schematic of the charge pump of a prior art phase-locked loop system.

Although the lateral PNP transistors of circuit 40 are useful in providing a steady state current, these lateral PNP transistors are too slow for the frequency demands of the high capacity Winchester disk drive, and are simply too slow in frequency response, to be useful for dynamic switching. As noted heretofore (FIG. 5), in the prior art, NPN transistors were used to charge the capacitor 57 down while PNP transistors were used to charge it up, in a sort of push-pull configuration. However, in an integrated circuit setting, it is difficult to design a substrate which is dominated by vertical NPN transistors and which also has PNP vertical transistors. Thus, unlike the prior art, a high speed push-pull configuration is not feasible.

Thus, in order to charge up the capacitor of the control circuit, a slightly reverse biased diode 42 (shown as a collector-base tied transistor) is used in conjunction with transistor 38. Current is normally diverted along the circuit indicated by arrow 48 from the current mirror 40. In order to allow the capacitor 78 of the control circuit to charge up, normally "on" transistor 38 is turned "off". Operationally, this is accomplished when a pulse 34 is provided by the phase detector 19 to indicate a desired charge up of the capacitor 78 (FIG. 2), turning "off" transistor 38. When such a pulse 34 is provided to the charge pump, the normally "ON" transistor 38 is turned "OFF" preventing forward bias current 48 from bypassing diode 42 and forcing the redirection of current along pathway 47 to charge the capacitor of the control circuit. When no "UP" signal 34 is present, and transistor 38 normally conducts, slightly reversed bias diode 42 acts as an open circuit thereby isolating the capacitor 78 (FIG. 2) from the current mirror 40. Emitter follower circuit 45 allows transistor 38 (when it is normally "on" indicated by the double circle) to draw current through diode 44 by slightly reverse biasing diode 42. When transistor 38 turns "off", circuit 45 forces diode 42 to become forward biased, allowing current to flow through pathway 47 to the control circuit capacitor by way of output 49.

Figure 4:
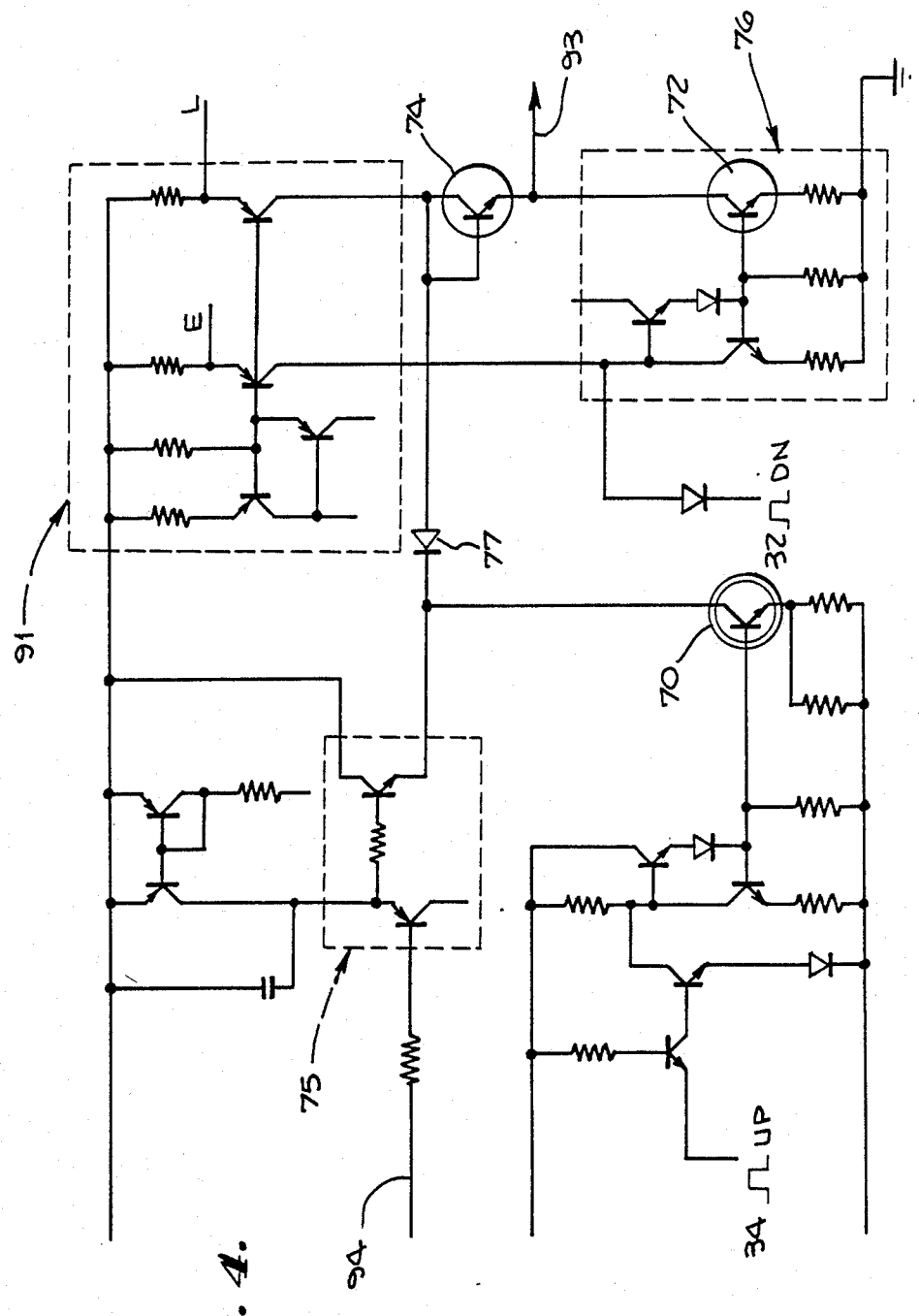
FIG. 4 shows the preferred embodiment of the internal circuit of the charge pump of FIG. 2.

With reference to FIG. 4, the preferred configuration shows that a charge down pulse 32 impressed upon network 76 turns "on" transistor 72 and allows the control circuit capacitor to discharge through transistor 72.

Alternatively, transistor 70 is normally "on" (indicated by the double circle) but diode 74, being reversed biased, acts as an open circuit and transistor 70 draws diverted current from the current mirror 91. When transistor 70 is turned "off", by action of the "up" charge pulse 34 to its base, then diode 74 is driven into a forward biased mode allowing current to flow through diode 74 and out to the control circuit capacitor by means of pathway 93. Emitter follower network 75 (which receives its control input on feedback lead 94 from buffer amplifier 26) assists in maintaining diode 74 in a reverse biased state by maintaining a voltage lower by the voltage drop across one junction from the input of buffer amplifier 26, when transistor 70 is normally "on", and acts to forward bias the diode 74 when the transistor 70 is driven "off" by "up" pulse 34.

It will be noted that in both FIGS. 3 and 4, the respective switching transistors 36 and 32 of FIG. 3 and 70 and 72 of FIG. 4 and their associated networks are all dynamic NPN transistors acting as constant current switches. These constant current switches act in a linear fashion so that the capacitor of the control current is charged linearly up and linearly down. The more current that is pumped into the capacitor, the faster the capacitor is charged up and down. The uniformity and linearity of rapidly charging up and charging down maintains the phase-locked loop in its desired locked condition over a wider tracking range. Applicant is able to maintain the loop and lock over a range of six volts from as high as nine volts down to three volts, about an average value of six volts. It is this fast switching ability by diverting current by means of transistors 38 (FIG. 3) and 70 (FIG. 4) that the Applicant's design is able to achieve the rapid speed of switching in an integrated circuit format using a homogeneous region of dynamic NPN transistors.

While it is understood that the preferred embodiment of this invention has been presented, alternative embodiments are possible, as shown in FIG. 4. Furthermore, additional equivalent embodiments, using for example, CMOS configuration in the N-channel and P-channel format, both enhancements and depletion modes, might be used to make an integrated chip operating in a similar diversionary circuit. It is believed that even if CMOS dynamic circuitry were made analogous and in accordance with Applicant's FIGS. 3 and 4, it would not function as quickly as Applicant's; but, such a CMOS configuration is deemed to be within the equivalence of this invention and the appended claims hereto. It is also noted that the present invention is applicable to other digital storage systems having high speed rotating disks, such as optical digital storage systems. Further, for certain types of integrated circuits PNP or some other type of transistor may operate more rapidly than NPN transistors, and the present invention contemplates the use of capacitor charging and discharging circuits both using the same predetermined type of high speed transistors. Accordingly, the present invention is not limited to the circuits as described hereinabove.

What is claimed is:

1. A Winchester Hard Disk Drive System, having an integrated circuit which includes a phase-locked loop circuit, comprising:
   a hard disk drive system, having a motorized hard disk drive assembly interacting with a head positioner to read and write data and timing instructions onto a plurality of hard Winchester disks driven by said assembly;
   phase-locked loop circuit means for deriving oscillator signals synchronized with a series of pulses sensed from said hard disk drive, said phase-locked loop means including:
   (a) a controllable oscillator;
   (b) voltage-controlled circuit means for determining the frequency of said oscillator;
   (c) means including at least one capacitor for providing a variable controlling voltage to said voltage-controlled circuit means; said capacitor having first and second terminals, the first of which is connected to ground or to a substantially fixed reference potential;
   (d) means connected to said second terminal of said capacitor for charging said capacitor including circuit means for providing a flow of current normally along a predetermined path, and switching means including NPN transistors for diverting said current from said predetermined path to charge said capacitor;
   (e) means connected to said second terminal of said capacitor for discharging said capacitor including NPN switching transistor means; and
   (f) said charging and discharging means being included in a single integrated circuit.

2. A Winchester Hard Drive system, having an integrated circuit which includes a phase-locked loop circuit, comprising:
   a hard disk drive system, having a motorized hard disk drive assembly interacting with a head positioner to read and write data and timing instructions onto a plurality of hard Winchester disks driven by said assembly;
   phase-locked loop circuit means for deriving oscillator signals synchronized with a series of pulses sensed from said hard disk drive, said phase-locked loop means including:
   (a) a controllable oscillator;
   (b) voltage-controlled circuit means for determining the frequency of said oscillator;
   (c) means including a capacitor for providing a variable controlling voltage to said voltage-controlled circuit means; said capacitor having first and second terminals, the first of which is connected to round or to a substantially fixed reference potential;
   (d) means connected to said second terminal of said capacitor for charging said capacitor including an array network having a plurality of homogeneous carrier dominated elements providing dynamic switching control using a constant current, said means for charging said capacitor further including NPN switching transistors for providing fast dynamic switching through a controlled current source; and
   (e) means connected to said second terminal of said capacitor for discharging said capacitor including NPN switching transistor means.

3. The Winchester Hard Drive System of claim 2 wherein said means for charging said capacitor is a charge pump having lateral PNP transistors providing a stable current source and homogeneous NPN transistors providing a network for diverting current from said constant current source in order to charge said capacitor.

4. The Winchester Hard Disk Drive System of claim 2 wherein said means for discharging said capacitor is said charge pump, which includes lateral PNP transistors for providing a constant current source and NPN transistors for dynamically switching said constant current, allowing said capacitor to discharge.

5. A digital storage system, having a motorized hard disk drive assembly interacting with a positioner to read and write data storage onto a hard storage disk driven by said assembly;
   phase-locked loop circuit means for deriving oscillator signals synchronized with a series of pulses sensed from said hard disk drive, said phase-locked loop means including:
   (a) a controllable oscillator;
   (b) voltage-controlled circuit means for determining the frequency of said oscillator;

(c) means including a capacitor for providing a variable controlling voltage to said voltage-controlled circuit means;

(d) means connected to said second terminal of said capacitor for charging said capacitor including circuit means for providing a flow of current normally along a predetermined path, and switching means including high speed transistors of a predetermined type for diverting said current from said predetermined path to charge said capacitor;

(e) means connected to said second terminal of said capacitor for discharging said capacitor including high speed switching transistors of the same predetermined type; and (f) said charging and discharging means being included in a single integrated circuit.

6. A Winchester Hard Disk Drive System, having a motorized hard disk drive assembly interacting with a head postioner to read and write data and timing instructions onto a plurality of hard Winchester disks driven by said assembly, said drive system including data separation circuit means for reconstruction of data recorded on said hard disk, said data separation circuit means comprising a phase-locked loop system which includes:

a phase comparison circuit;

a voltage-controlled oscillator;

a control circuit including a capacitor for controlling said oscillator; said capacitor having first and second terminals, the first of which is connected to ground or to a substantially fixed reference potential;

charge pump means for pumping up and pumping down said control circuit;

said phase comparison circuit receiving a variable reference receiving signal from said oscillator and comparing said reference frequency signal with a real time frequency signal derived outside said phase-locked loop system from said hard disks and said drive assembly;

said phase comparison circuit having an output phase different signal being provided to said charge pump means, said output phase difference signal being a function of the difference between said reference frequency signal and said real time frequency signal;

said charge pump means including:

a monolithic integrated circuit having:

current source circuit means for providing a steady and uniform operational signal, said current source circuit means including all lateral-space PNP bipolar transistor elements of said intergrated circuit; and dynamic switching means connected to said second terminal of said capacitor for rapidly switching said operational signal including a first NPN network of bipolar components for charging up said capacitor within said control circuit; and a second NPN network fo bi-polar components connected to said second terminal of said capacitor for charging down said capacitor, said charging up and down commenced in response to the output phase different signal from said phase comparison circuit;

said control circuit operating to varying the reference frequency signal output from said oscillator as a consequence of receiving pump and up and pump down instructions from said charge pump means;

whereby, said phase-locked loop system locks onto said real-time frequency signal, enabling the data separation circuit means to synchronize said reference frequency signal and said real-time frequency signal, creating a data windowq, through which window a utilization circuit which processes data stored on said hard disks, may read and write onto said disks at a data rate derived within said data window which may be logically processed by said utilization circuit.

7. A Winchester Hard Disk Drive system, having an integrated circuit which includes a phase-locked loop circuit, comprising:

a hard disk drive system, having a motorized hard disk drive assembly interacting with a head positioner to read and write data and timing instructions onto a plurality of hard Winchester disks driven by said assembly;

phase-locked loop circuit means for deriving oscillator signals synchronized with a series of pulses sensed from said hard disk drive, said phase-locked loop means including:

(a) a controllable oscillator;

(b) voltage-controlled circuit means for determining the frequency of said oscillator;

(c) means including a capacitor for providing a variable controlling voltage to said voltage-controlled circuit means; said capacitor having first and second terminals, the first of which is connected to ground or to a substantially fixed reference potential;

(d) means for charging said capacitor including an array network having a plurality of homogeneous carrier dominated elements providing dynamic switching control using a constant current;

(e) means for discharging said capacitor including NPN switching transistor means; and (f) said means including the capacitor for providing a constant current controlled voltage to said voltage controlled circuit further including:

(1) a buffer amplifier means, said buffer amplifying means providing a current controlled buffer between said means for charging for said capacitor and for providing controlled voltage to said voltage controlled circuit; and, (2) a varactor for providing a voltage-controlled source to said voltage-controlled circuit.

8. A Winchester Hard Disk Drive System, having a motorized hard disk drive assembly interacting with a head positioner to read and write data and timing instructions onto a plurality of hard Winchester disks driven by said assembly, said drive system including data separation circuit means for reconstruction of data recorded on said hard disk, said data separation circuit means comprising a phase-locked loop system which includes:

a phase comparison circuit;

a voltage-controlled oscillator;

a control circuit including a capacitor for controlling said oscillator;

charge pump means for pumping up and pumping down said control circuit;

said phase comparison circuit receiving a variable reference receiving signal from said oscillator and comparing said reference frequency signal with a real time frequency signal derived outside said phase-locked loop system from said hard disks and said drive assembly;

said phase comparison circuit having an output phase different signal being provided to said charge pump means, said output phase difference signal being a function of the difference between said reference frequency signal and said real time frequency signal;

said charge pump means including:

a monolithic integrated circuit having:

current source circuit means for providing a steady and uniform operational signal, said current source circuit means including all lateral-space PNP bipolar transistor elements of said integrated circuit; and dynamic switching means for rapidly switching said operational signal including a first NPN network of bipolar components for charging up said capacitor within said control circuit;

a second NPN network of bi-polar components for charging down said capacitor, said charging up and down commenced in response to the output phase different signal from said phase comparison circuit;

said control circuit operating to varying the reference frequency signal output from said oscillator as a consequence of receiving pump up and pump down instructions from said charge pump means;

a buffer amplifier operatively associated with said charge pump means and said control circuit, said buffer amplifier receiving pumping up and pumping down signals from said charge pump, amplifying and smoothing said signals, and providing said signals to said control circuit; and said buffer amplifier providing feedback to said charge pump to insure proper operation of said charge pump means;

whereby, said phase-locked loop system locks onto said real-time frequency signal, enabling the data separation circuit means to synchronize said reference frequency signal and said real-time frequency signal, creating a data window, through which window a utilization circuit which processes data stored on said hard disks, may read and write onto said disks at a data rate derived within said data window which may be logically processed by said utilization circuit.

9. A Winchester Hard Disk Drive System, having a motorized hard disk drive assembly interacting with a head positioner to read and write data and timing instructions onto a plurality of hard Winchester disks driven by said assembly, said drive system including data separation circuit means for reconstruction of data recorded on said hard disk, said data separation circuit means comprising a phase-locked loop system which includes:

a phase comparison circuit;

a voltage-controlled oscillator;

a control circuit including a capacitor for controlling said oscillator;

charge pump means for pumping up and pumping down said control circuit;

said phase comparison circuit receiving a variable reference receiving signal form said oscillator and comparing said reference frequency signal with a real time frequency signal derived outside said phase-locked loop system from said hard disks and said drive assembly;

said phase comparison circuit having an output phase different signal being provided to said charge pump means, said output phase difference signal being a function of the difference between said reference frequency signal and said real time frequency signal;

said charge pump means including:

a monolithic integrated circuit having:

current source circuit means for providing a steady and uniform operational signal, said current source circuit means including all lateral-space PNP bipolar transistor elements of said integrated circuit; and dynamic switching means for rapidly switching said operational signal including a first NPN network of bipolar components for charging up said capacitor within said control circuit;

a second NPN network of bi-polar components for charging down said capacitor, said charging up and down commenced in response to the output phase different signal from said phase comparison circuit;

said control circuit operating to varying the reference frequency signal output form said oscillator as a consequence of receiving pump up and pump down instructions from said charge pump means; and a strobe means for testing the balance and efficiency of said current source circuit means for said charge pump wherein said strobe means is operatively associated with a plurality of resistor elements, half of which are tied to one leg of a balancing circuit within said current source circuit means, and the other half of said resistors tied to a second leg of said current source circuit means;

whereby, said phase-locked loop system locks onto said real-time frequency signal, enabling the data separation circuit means to synchronize said reference frequency signal and said real-time frequency signal, creating a data window, through which window a utilization circuit which processes data stored on said hard disks, may read and write onto said disks at a data rate derived within said data window which may be logically processed by said utilization circuit.

* * * * *